(12) United States Patent
Jalloul et al.

(10) Patent No.: US 8,086,928 B2
(45) Date of Patent: Dec. 27, 2011

(54) METHODS AND SYSTEMS FOR TERMINATING AN ITERATIVE DECODING PROCESS OF A FORWARD ERROR CORRECTION BLOCK

(75) Inventors: Louay Jalloul, Santa Clara, CA (US); Sriram Mudulodu, Santa Clara, CA (US)

(73) Assignee: Broadcom Corporation, Irvine, CA (US)

( * ) Notice: Subject to any disclaimer, the term of this patent is extended or adjusted under 35 U.S.C. 154(b) by 1120 days.

(21) Appl. No.: 11/893,329

(22) Filed: Aug. 15, 2007

(65) Prior Publication Data

US 2009/0049358 A1    Feb. 19, 2009

(51) Int. Cl.
 *H03M 13/00* (2006.01)
(52) U.S. Cl. ......... 714/752; 714/755; 714/786; 714/799
(58) Field of Classification Search .................. 714/752, 714/755, 758, 786, 799, 704, 780, 801
See application file for complete search history.

(56) References Cited

U.S. PATENT DOCUMENTS

| | | | |
|---|---|---|---|
| 6,865,708 B2 * | 3/2005 | Wang | 714/758 |
| 7,266,750 B1 * | 9/2007 | Patapoutian et al. | 714/758 |
| 7,673,213 B2 * | 3/2010 | Chugg et al. | 714/755 |
| 7,765,453 B2 * | 7/2010 | Duggan | 714/755 |
| 7,783,958 B1 * | 8/2010 | Eidson et al. | 714/780 |
| 2006/0107193 A1 * | 5/2006 | Park et al. | 714/801 |

* cited by examiner

*Primary Examiner* — Fritz Alphonse
(74) *Attorney, Agent, or Firm* — Sterne Kessler Goldstein & Fox, PLLC

(57) ABSTRACT

The invention provides methods and systems for terminating an iterative decoding process of a Forward Error Correction block (FEC). The iterative decoding process of the FEC block is terminated upon determining that the FEC block cannot be decoded successfully. A method comprises calculating a metric based on one or more Log Likelihood Ratios (LLRs) corresponding to a first number of iterations of the iterative decoding process of the FEC block. The method further comprises, formulating one or more stopping criteria for the iterative decoding process based on a variation pattern of the metric over a second predetermined number of iterations of the iterative decoding process. The second predetermined number of iterations is a subset of the first number of iterations. Moreover, the method comprises terminating the iterative decoding process of the FEC block based on the one or more stopping criteria.

21 Claims, 6 Drawing Sheets

US 8,086,928 B2

METHODS AND SYSTEMS FOR TERMINATING AN ITERATIVE DECODING PROCESS OF A FORWARD ERROR CORRECTION BLOCK

FIELD OF THE INVENTION

The present invention generally relates to communication systems. More specifically, the present invention relates to methods and systems for terminating an iterative decoding process of a forward error correction (FEC) block in a communication system.

BACKGROUND

Existing communication systems, such as those based on 3G, IEEE 802.16/WIMAX standards, may use turbo codes as error correction codes for encoding a data block to be transmitted. The data block can be encoded to obtain a Forward Error Correction (FEC) block. In a real scenario, the FEC block encoded using turbo codes can be transmitted from a transmitter to a receiver through a noisy channel. The FEC block enables the receiver to receive the data block with reduced errors despite the noisy channel. Accordingly, the receiver may employ a turbo decoder system for decoding the FEC block received from the transmitter.

Typically, a turbo decoder system consists of two elementary decoders that are serially concatenated. For example, the turbo decoder system may include two elementary decoders, referred to as decoder D1 and decoder D2. Output of the decoders D1 can be output L1 and output of the elementary decoder D2 can be output L2. The output L1 and the output L2 indicate soft information, such as a reliability of a bit being either 0 or 1, related to bits of the FEC block received from the transmitter. Output L1 and output L2 can be used to calculate the Log Likelihood Ratios (LLRs). The LLRs are related to the probability of a bit in the FEC block to be a 0 or 1.

When the FEC block is received by the receiver, the FEC block is decoded by the decoder D1 to produce output L1. Further, the output L1 is provided as an input to the decoder D2. Subsequently, the output L1 is decoded by the decoder D2 to produce output L2.

The decoding of the FEC block is performed iteratively for ensuring correct decoding of the bits in the FEC block. In general, accuracy of decoding the FEC block by the turbo encoder system is high, if number of iterations corresponding to the decoding of the FEC block is high. However, higher number of iterations for decoding the FEC block leads to an increase in power consumption and processing time of the turbo decoder system. Consequently, power consumption and throughput of the turbo decoder system may significantly be affected.

Several techniques have been proposed that terminate the iterative decoding process as soon as the FEC block is deemed to be successfully decoded. This reduces power consumption and improves the decoder processing throughput, for the case when the decoding of the FEC block may be eventually deemed successful. However, several FEC blocks may be significantly corrupted which may result in unsuccessful decoding even after a large number of iterations. This can lead to wasteful power consumption by the turbo decoder system. Hence there is a need to reduce the number of iterations of the iterative decoding process of the FEC block at the turbo decoder system in such situations.

SUMMARY

An embodiment provides methods and systems for terminating an iterative decoding process of a Forward Error Correction (FEC) block.

Further, an embodiment provides methods and systems for formulating one or more stopping criteria for the iterative decoding process of the FEC block.

Another embodiment provides receiving a stopping indication for stopping the iterative decoding process of the FEC block.

Embodiments described above include calculating a metric based on one or more Log Likelihood Ratios (LLRs) corresponding to a first number of iterations of the iterative decoding process of the FEC block. The metric can be a Mean Absolute Log-Likelihood Ratio (MALLR) calculated at each iteration or one or more pairs of consecutive half iterations of the first number of iterations. Further, a predetermined number of bits of the FEC block may be used to calculate the metric. Subsequently, one or more stopping criteria are formulated for the iterative decoding process based on a variation pattern of the metric over a second predetermined number of iterations of the iterative decoding process. The second predetermined number of iterations is a subset of the first number of iterations. Upon formulating the one or more stopping criteria, the iterative decoding process of the FEC block is terminated when the one or more stopping criteria is met. The second predetermined number of iterations is a design parameter that can be chosen prior to or while performing the iterative decoding process of the FEC block.

In an embodiment, the one or more stopping criteria include checking a flatness of the variation pattern of the metric. Checking the flatness of the variation pattern of the metric may include determining whether a difference between a minimum metric value and a maximum metric value of the metric over the second predetermined number of iterations is less than or equal to a first predefined threshold. Further, checking the flatness of the variation pattern of the metric may include checking if an increment in the metric is less than or equal to a predefined increment threshold, checking if a ratio between two or more successive metrics is less than or equal to a predefined successive ratio threshold, checking if a local scope of the metric is less than or equal to a predefined local slope threshold and checking if a global slope of the metric is less than or equal to a predefined global threshold. The local slope is computed over a third predetermined number of iterations, the third predetermined number of iterations being less than the second predetermined number of iterations. Moreover, the global slope is computed over the first number of iterations of the iterative decoding process. The first predefined threshold, the predefined increment threshold, the predefined successive ratio threshold, the predefined local slope threshold, the predefined global threshold and the third predetermined number of iterations are design parameters that can be chosen prior to or while performing the iterative decoding process of the FEC block.

In another embodiment, the one or more stopping criteria include identifying a non-increasing nature of the metric. The non-increasing nature of the metric includes checking over the second predetermined number of iterations of the iterative decoding process, if a net increase in the metric is less than or equal to a second predefined threshold.

Embodiments described above further include receiving a stopping indication that is generated based on one or more stopping criteria. Consequently, the iterative decoding process of the FEC block is stopped upon receiving the stopping indication.

Embodiments described above further include, a device for terminating the iterative decoding process of the FEC block. The device comprises a memory and a processor operatively coupled to the memory. The memory is configured for storing one or more of a first predefined threshold, a second predefined threshold, a predefined increment threshold, a predefined successive ratio threshold, a predefined local slope threshold and a predefined global slope threshold. The processor is configured for calculating a metric using one or more LLRs pertaining to a first number of iterations of a predetermined number of bits of the FEC block. Further, the processor is configured for formulating one or more stopping criteria for the iterative decoding process of the FEC block based on a variation pattern of the metric. Moreover, the processor is configured for terminating the iterative decoding process of the FEC block based on the one or more stopping criteria.

BRIEF DESCRIPTION OF DRAWINGS

A more complete appreciation of the present invention is provided by reference to the following detailed description when considered in conjunction with the accompanying drawings in which reference symbols indicate the same or similar components, wherein.

Figure 1:
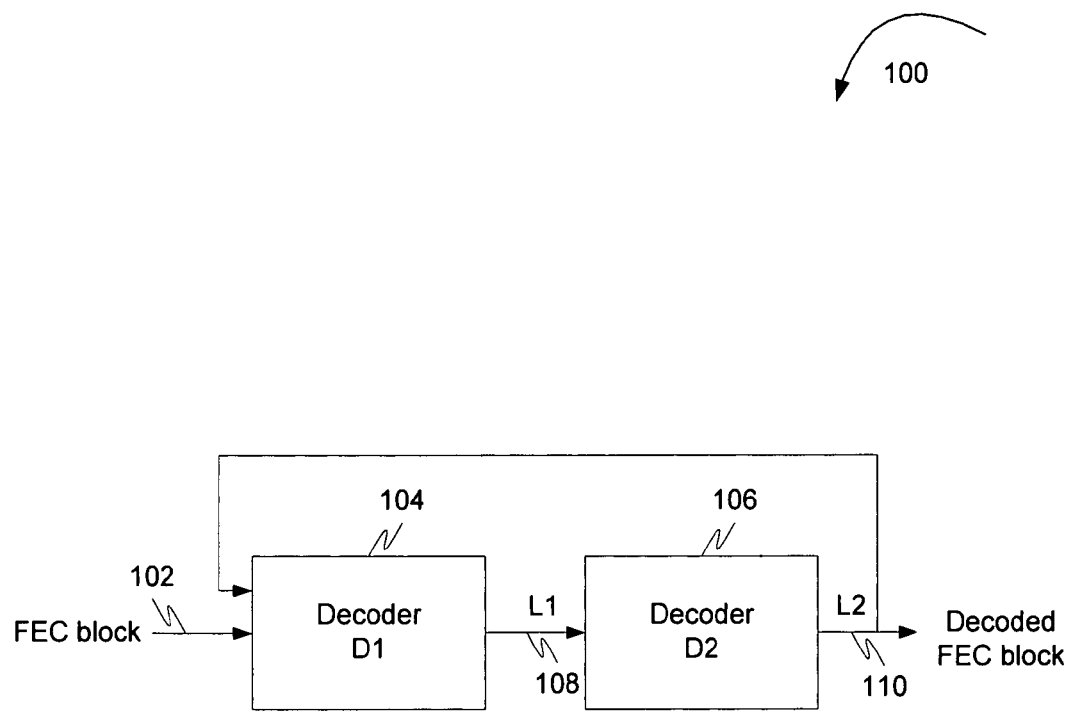
FIG. 1 illustrates an exemplary representation of an iterative decoding process of a Forward Error Correction (FEC) block at a turbo decoder, in accordance with an embodiment.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

While embodiments may be described in many different forms, some of which are shown in the figures and described herein in detail, it is understood that the present disclosure is to be considered as an example of the principles of the present invention and not intended to limit the invention to the specific embodiments shown and described. Further, the terms and words used herein are not to be considered limiting, but rather merely descriptive. It will also be appreciated that for simplicity and clarity of illustration, common and well-understood elements that are useful or necessary in a commercially feasible embodiment may not be depicted in order to facilitate a less obstructed view of these various embodiments. Also, elements shown in the figures have not necessarily been drawn to scale. For example, the dimensions of some of the elements are exaggerated relative to each other. Further, where considered appropriate, reference numerals have been repeated among the figures to indicate corresponding elements.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the present invention described herein may be comprised of one or more conventional processors and unique stored program instructions that control the one or more processors to implement, in conjunction with certain non-processor circuits, some, most, or all of the functions of methods and systems for terminating an iterative decoding process of a Forward Error Correction (FEC) block described herein. The non-processor circuits may include, but are not limited to, a radio receiver, a radio transmitter, signal drivers, clock circuits, power source circuits, and user input devices. As such, these functions may be interpreted as steps of a method for terminating an iterative decoding process of an FEC block. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Generally speaking, pursuant to various embodiments, methods and systems for terminating an iterative decoding process of an FEC block are provided. The method comprises calculating a metric based on one or more Log Likelihood Ratios (LLRs) that correspond to a first number of iterations of the iterative decoding process of the FEC block. Further, one or more stopping criteria are formulated for the iterative decoding process with respect to a variation pattern of the metric over a second predetermined number of iterations of the iterative decoding process. Subsequently, the iterative decoding process of the FEC block is terminated based on the one or more stopping criteria.

Referring to the drawings and in particular to FIG. 1, an exemplary representation of an iterative decoding process of an FEC block at a turbo decoder 100 is shown in accordance with an embodiment. A transmitter that wants to transmit data to a receiver may encode the data using a turbo code to obtain an FEC block. The FEC block is received as an FEC block 102 at turbo decoder 100 of the receiver. Those skilled in the art will realize that if FEC block 102 is received over a noisy channel, then FEC block 102 may include some errors. Turbo decoder 100 decodes FEC block 102 so as to detect and, in some embodiments, correct the errors in FEC block 102. If, FEC block 102 is estimated as a successfully decoded FEC block with respect to an independent success criterion, the iterative decoding process of FEC block 102 may directly be terminated. For instance, the independent success criterion can be checking whether a minimum absolute LLR of the metric at a given iteration of the first number of iterations exceeds a success threshold. The minimum absolute LLR of the metric is obtained over total number of bits of the FEC block. If the minimum absolute LLR of the metric exceeds the success threshold, the decoding of the FEC block may be deemed successful and the iterative decoding process of the FEC block may, consequently, be terminated.

Referring back to FIG. 1, turbo decoder 100 includes two elementary decoders such as decoder D1 104 and decoder D2 106 that are concatenated serially. Decoder D1 104 decodes FEC block 102 to produce output L1 108. Subsequently, output L1 108 is provided as an input to decoder D2 106. Thereafter output L1 108 is used by decoder D2 106 to produce output L2 110. Output L1 and output L2 may each include one or more real valued entities, where real valued entities are real numbers. Moreover, FEC block 102 is iteratively decoded by providing output L2 110 as a feedback to decoder D1 104.

The process of decoding FEC block 102 by one of decoder D1 104 and decoder D2 106 is referred to as a Half Iteration (HI). On the other hand, the process of decoding FEC block 102 by decoder D1 104 first to obtain output L1 108 and then using this output L1 108 by decoder D2 106 to obtain output L2 110 is referred to as a Full Iteration (FI). Any one of an HI and a FI is referred to as an iteration hereinafter, unless specified otherwise.

When iteratively decoding FEC block 102 at turbo decoder 100, a metric is calculated based on one or more LLRs corresponding to a first number of iterations. The one or more LLRs can be determined from the output L1 108 and output L2 110 obtained at each iteration of the first number of iterations of the iterative decoding process. The first number of iterations can be the number of iterations performed till a given time. For instance, if 10 iterations are performed till a given time, then the LLRs can be determined at output L1 108 and output L2 110 of each of the 10 iterations. The one or more LLRs indicate the likelihood of a bit from the plurality of bits in FEC block 102 to be a 0 or a 1.

Further, one or more stopping criteria are formulated based on a variation pattern of the metric for the iterative decoding process of FEC block 102, over a second predetermined number of iterations of the iterative decoding process of the FEC block. Based on the one or more stopping criteria, the iterative decoding process of FEC block 102 is terminated at turbo decoder 100. The stopping criteria enables turbo decoder 100 to determine, after the first number of iterations, that FEC block 102 is so corrupted that further iterations may not result in successful decoding. This helps turbo decoder 100 to reduce power consumption and processing time, in the case when decoding FEC block 102 fails.

Figure 2:
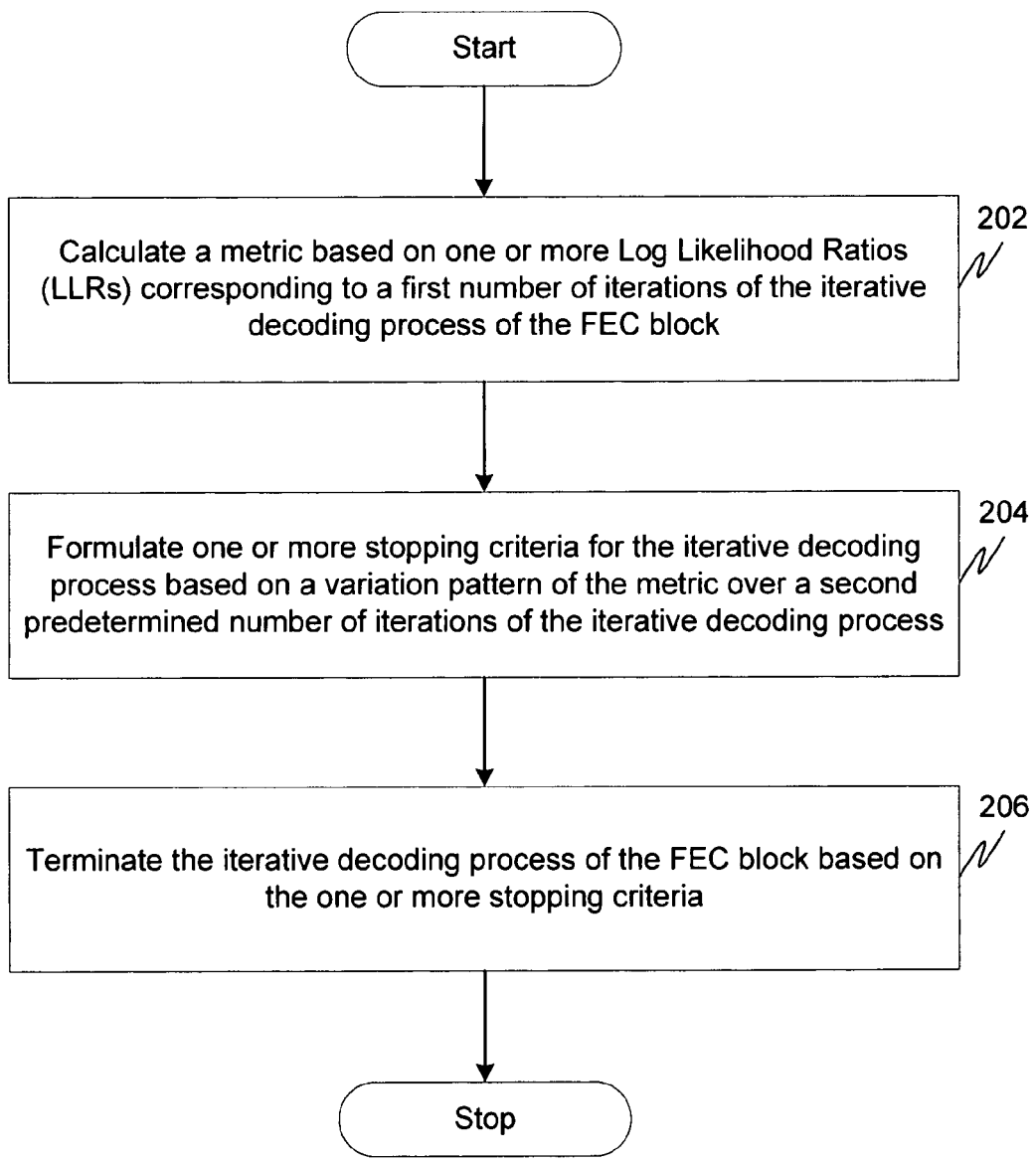
FIG. 2 illustrates a flow diagram of a method for terminating an iterative decoding process of an FEC block, in accordance with an embodiment.

Turning now to FIG. 2, a flow diagram of a method for terminating an iterative decoding process of an FEC block is shown, in accordance with an embodiment. Referring back to FIG. 1, FEC block 102 is received at turbo decoder 100. Subsequently, as mentioned earlier, one or more LLRs may be determined for a first number of iterations of FEC block 102. Those skilled in the art will appreciate that a large positive value associated with an LLR may signify that a bit corresponding to that LLR can be a 1. On the contrary, a large negative value of an LLR may signify that a bit corresponding to that LLR can be a 0. In an embodiment, magnitude of an LLR indicates a reliability of a bit from the plurality of bits of FEC block 102 to be a 0 or a 1.

A metric is, then, calculated at 202 based on the one or more LLRs corresponding to a first number of iterations of the iterative decoding process of FEC block 102. In an embodiment, the metric is calculated based on a sum of absolute LLRs computed over the first number of iterations of the iterative decoding process of the FEC block. As mentioned earlier, the first number of iterations may include half iterations and/or full iterations. The sum of absolute LLRs may denote summing up of the one or more absolute LLRs of one or more bits of the FEC block calculated over each iteration of the first number of iterations. For example, if the first number of iterations is 5, then the sum of absolute LLRs may be calculated at each of the 5 iterations, which can be $0.5^{th}$ iteration, $1^{st}$ iteration, $1.5^{th}$ iteration, $2^{nd}$ iteration and $2.5^{th}$ iteration.

In another embodiment, the metric is a Mean Absolute Log-Likelihood Ratio (MALLR) corresponding to the first number of iterations of the iterative decoding process of FEC block 102. The MALLR can be calculated using the equation, $$MALLR = \frac{1}{N}\sum_{j=1}^{N} |LLR(k, j)| \quad (1)$$

where,

N denotes total number of bits in FEC block 102;

LLR(k, j) denotes LLR of current $k^{th}$ half iteration;

|x| denotes the absolute value of a number, x;

k denotes the iteration index that can take values such as 0.5, 1, 1.5, 2, 2.5 . . . etc, where 0.5 corresponds to one HI, 1 corresponds to the first FI, 1.5 corresponds to the 3rd HI, and so on; and j denotes a bit in FEC block 102.

According to an embodiment, the MALLR is computed over one or more pairs of successive half iterations belonging to the first number of iterations of the iterative decoding process of FEC block 102. In an exemplary embodiment, the MALLR can be computed over one or more pairs of successive half iterations as follows:

$$MALLR = \frac{1}{2N}\sum_{j=1}^{N} |LLR1(k, j)| + |LLR2(k, j)| \quad (2)$$

Where,

LLR1(k, j) denotes LLR of bit j after iteration k included in the output L1 108 of decoder D1 104 and LLR2(k, j) denotes LLR of bit j after iteration k included in the output L2 110 of decoder D2 106.

In yet another embodiment, one or more LLRs of a predetermined number of bits of FEC block 102 are used for calculating the metric. For instance, if FEC block 102 includes 16 bits, LLRs of only 10 bits may be used to calculate the metric, in order to limit the processing power and processing time. In yet another embodiment, the metric may be the one or more LLRs of the predetermined number of bits of FEC block 102.

Subsequent to calculating the metric, one or more stopping criteria are formulated at 204 for the iterative decoding process based on a variation pattern of the metric over a second predetermined number of iterations of the iterative decoding process. The second predetermined number of iterations is a subset of the first number of iterations. Moreover, the second predetermined number of iterations can include half iterations and/or full iterations. For instance, the second predetermined number of iterations may be 3. Thus, the metric may be observed till the variation pattern of the metric for at least 3 iterations meets the one or more stopping criteria, after which the iterations may be stopped. Hence, in effect, the iterative decoding process can be stopped, when the variation pattern of the metric for at least the last 3 iterations of the first number of iterations meets the stopping criteria.

In an embodiment, the one or more stopping criteria include checking a flatness of the variation pattern of the metric for the first number of iterations. In this embodiment, if the variation pattern of the metric is approximately flat for at least the second predetermined number of iterations of the iterative decoding process of FEC block 102, then a stopping criterion may be considered to be met. In another embodiment, the one or more stopping criteria include identifying a non-increasing nature of the metric. In this embodiment, if the metric is non-increasing for at least the second predetermined number of iterations of the iterative decoding process of FEC block 102, then another stopping criterion may be considered to be met. The formulation of the one or more stopping criteria is explained in detail in conjunction with FIG. 3 described below. At 206, the iterative decoding process of FEC block 102 is terminated based on the one or more stopping criteria. Essentially, if the one or more stopping criteria are met after the first number of iterations of FEC block 102, the iterative decoding process of FEC block 102 is terminated at 206.

Figure 3A:
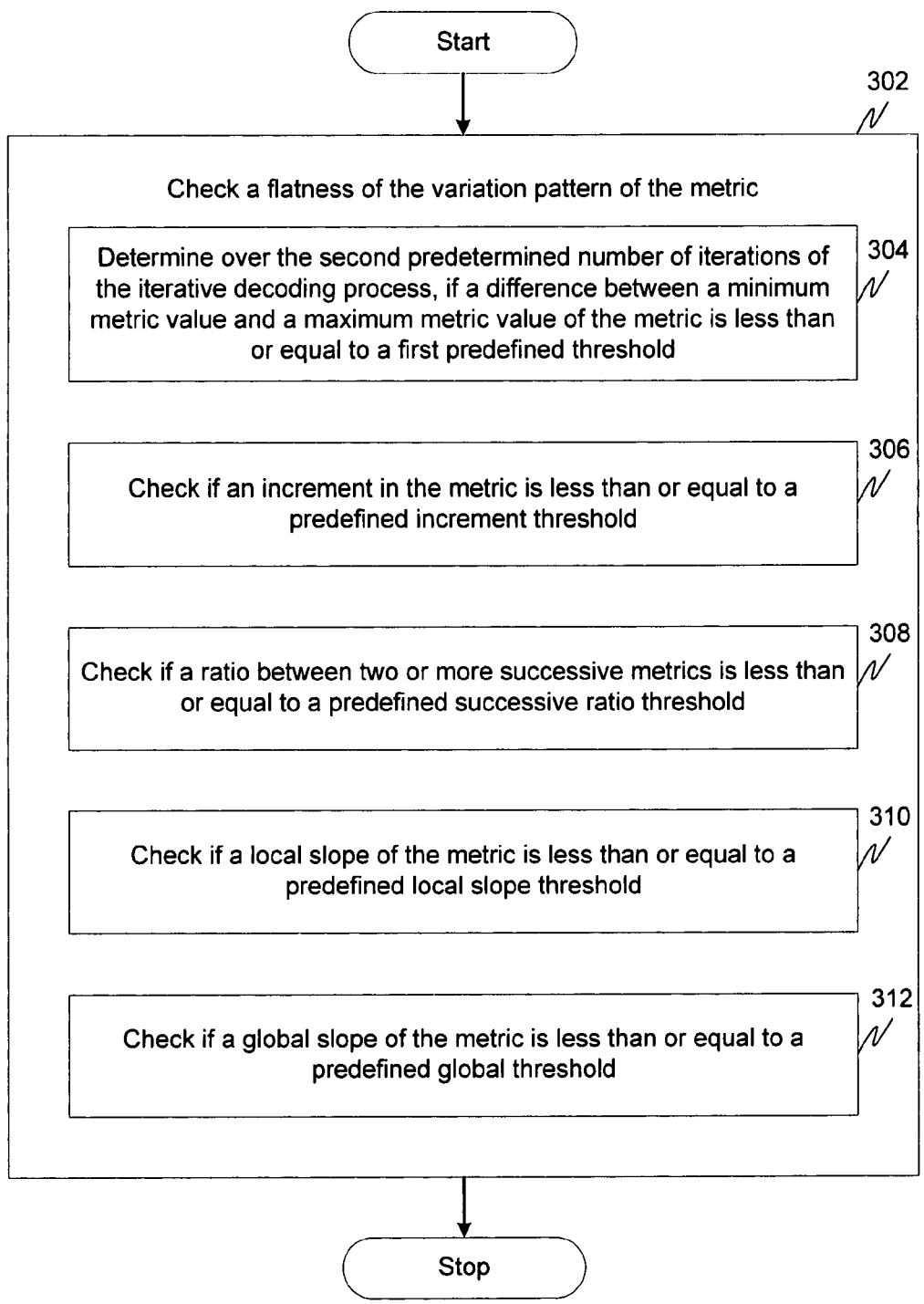
FIG. 3 illustrates a flow diagram of one or more stopping criteria formulated for terminating an iterative decoding process of an FEC block, in accordance with an embodiment.

Turning now to FIG. 3, a flow diagram of one or more stopping criteria formulated for terminating an iterative decoding process of an FEC block, in accordance with an embodiment is shown. Referring, in particular, to FIG. 3A, at 302, the one or more stopping criteria includes checking a flatness of the variation pattern of the metric. Accordingly, in a first embodiment, at 304, it is determined, whether a difference between a minimum metric value and a maximum metric value of the metric over the second predetermined number of iterations is less than or equal to a first predefined threshold. For instance, after each iteration, a difference between a minimum metric value and a maximum metric value over the last 3 iterations may be calculated. If the difference is less than the first predefined threshold, then the iterative decoding process of FEC block 102 may be terminated. Else, another iteration may be performed and the difference may again be determined for the last 3 iterations. In this example, the second predetermined number of iterations is 3.

Those skilled in the art will realize that any method known in the art can be used for determining if the difference between the minimum metric value and the maximum metric value of the metric is less than or equal to the first predefined threshold. In an embodiment, the first predefined threshold is defined based on a front end scaling factor or a Signal to Interference Noise Ratio (SINR) estimate for FEC block 102.

Further, in a second embodiment, it is checked, at 306, whether an increment in the metric is less than or equal to a predefined increment threshold. For example, the predefined increment threshold may be equal to 4 and the number of iterations over which the increment in the metric needs to be checked, which is essentially the second predetermined number of iterations, may be equal to 3. If the metrics calculated over the last 4 iterations is equal to 20, 22, 24 and 26, then the increment in the metric over each of the second predetermined number of iterations, which is over the last 4 iterations, is equal to 2 which is less than the predefined increment threshold. Consequently, one of the stopping criteria is met and the iterative decoding process of FEC block 102 may be terminated.

In a third embodiment, it is checked at 308 whether a ratio between two or more successive metrics is less than or equal to a predefined successive ratio threshold. For example, the second predetermined number of iterations may be 4 and the predefined successive ratio threshold may be 0.9. Let the successive metrics calculated over the last four iterations be equal to 20, 24, 30 and 34. It can be noted that the ratio between the first and the second successive metrics is 0.83. Similarly, the ratio between the other pairs of successive metrics is approximately 0.8 and 0.89 respectively. Since the ratio between the successive metrics calculated over the second predetermined number of iterations is less than the predefined successive ratio threshold of 0.9, one of the stopping criteria is met and the iterative decoding process of FEC 102 may be terminated.

Further, in a fourth embodiment, it is checked at 310 whether a local slope of the metric is less than or equal to a predefined local slope threshold. The local slope of the metric is computed over a third predetermined number of iterations. The third predetermined number of iterations is less than the second predetermined number of iterations. For example, let the second predetermined number of iterations be equal to 8 and the third predetermined number of iterations be equal to 2. Further, let the local slope of the metric computed over 2 iterations be 0.25. If for instance, the predefined local slope threshold is 0.3, the computed local slope of the metric over 2 iterations is less than the predefined local slope threshold. Accordingly, the iterative decoding process of FEC block 102 may be terminated.

Additionally, in a fifth embodiment, it is checked at 312 if a global slope of the metric is less than or equal to a predefined global threshold. The global slope of the metric is a quantity computed at a given iteration of the first number of iterations of the iterative decoding process. Accordingly, if the quantity is less than or equal to the predefined global threshold for the second predetermined number of iterations, the iterative decoding process of FEC block 102 may be terminated. Further, it would be apparent to a person skilled in the art that the one or more stopping criteria can be used in any combination for checking the flatness of the variation pattern of the metric.

Figure 3B:
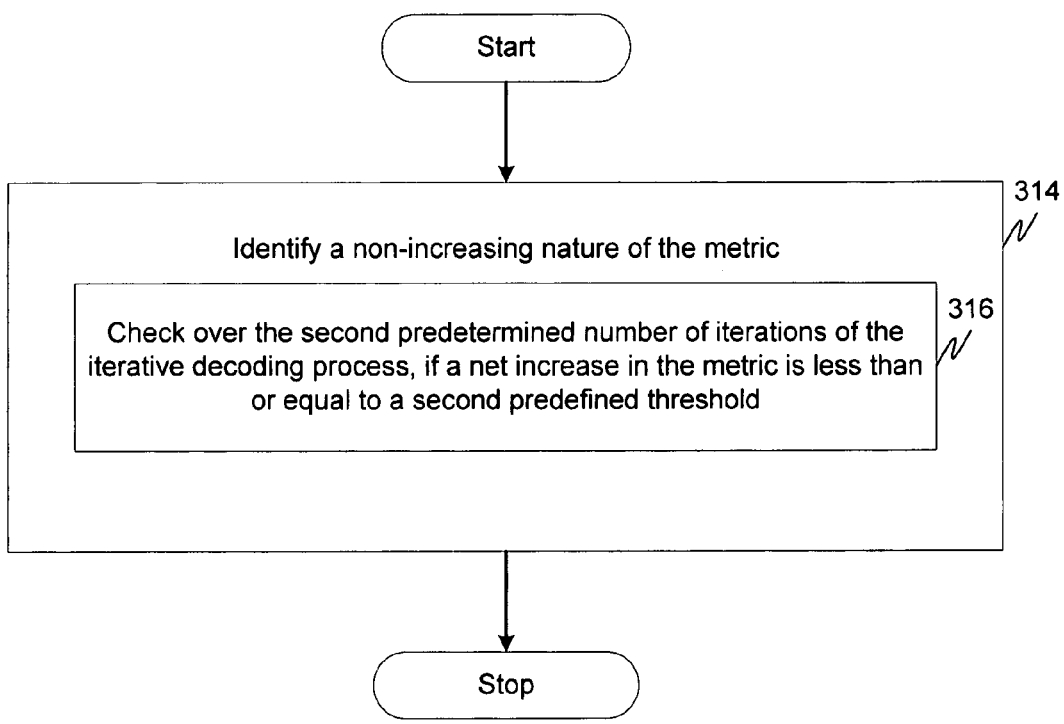

Referring now to FIG. 3B, the one or more stopping criteria includes identifying a non-increasing nature of the metric at 314. For identifying the non-increasing nature of the metric, it is checked at 316, whether a net increase in the metric over the second predetermined number of iterations is less than or equal to a second predefined threshold. For instance, the second predetermined number of iterations may be 4 and the metric computed over the last 4 iterations may be equal to 15, 17, 18 and 22. Accordingly, it can be noted that the net increase in the metric over the second predetermined number of iterations is 7. If, for instance, the second predefined threshold for the net increase is 10, it will be determined that the net increase in the metric over the last 4 iterations is less than the second predefined threshold. Therefore, the iterative decoding process of FEC block 102 may be terminated.

Figure 4:
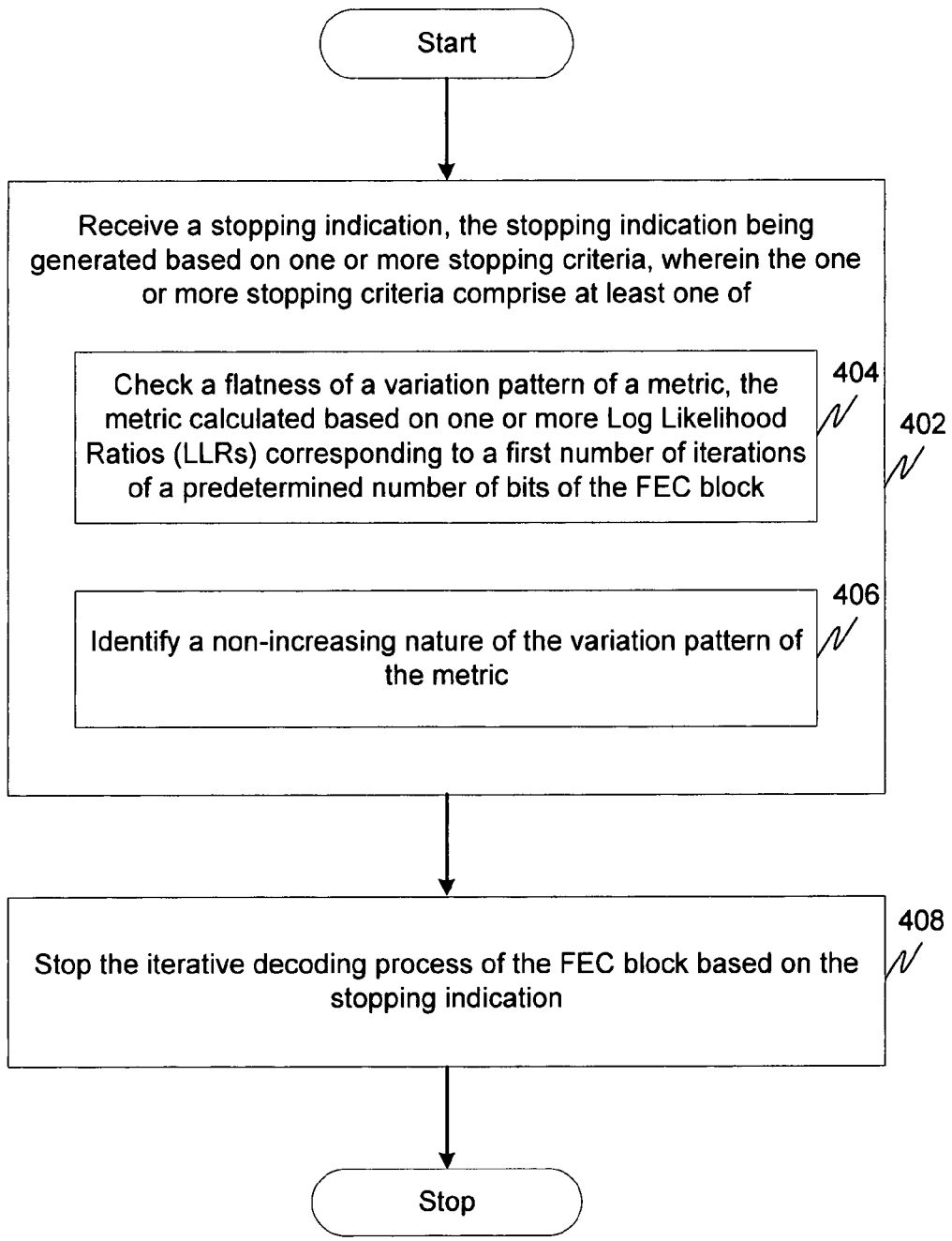
FIG. 4 illustrates a flow diagram of a method for stopping an iterative decoding process of an FEC block, in accordance with an embodiment.

Turning now to FIG. 4, a flow diagram of a method for stopping an iterative decoding process of FEC block 102 is illustrated in accordance with an embodiment. As mentioned earlier, turbo decoder 100 decodes FEC block 102 using an iterative decoding process. At 402, a stopping indication is received for stopping the iterative decoding process of FEC block 102. In an embodiment, the stopping indication may be a signal. A stopping indication is generated based on one or more stopping criteria for the iterative decoding process of FEC block 102.

In an embodiment, the one or more stopping criteria include checking a flatness of a variation pattern of a metric, at 404. The metric is calculated based on one or more LLRs corresponding to a first number of iterations of a predetermined number of bits of FEC block 102. Calculation of the metric is described in detail in conjunction with FIG. 2. Further, in another embodiment, the one or more stopping criteria include identifying a non-increasing nature of the variation pattern of the metric, at 406. Thereafter, at 408, the iterative decoding process of FEC block 102 is stopped upon receiving the stopping indication.

In an embodiment, the metric is calculated after each iteration or a pair of half iterations of the iterative decoding process of FEC block 102. After each iteration or a pair of half iterations, it may be checked if the variation pattern of the metric over a second predetermined number of iterations meets the one or more stopping criteria. The stopping indication may be generated as soon as the variation pattern of the metric meets the one or more stopping criteria.

Figure 5:
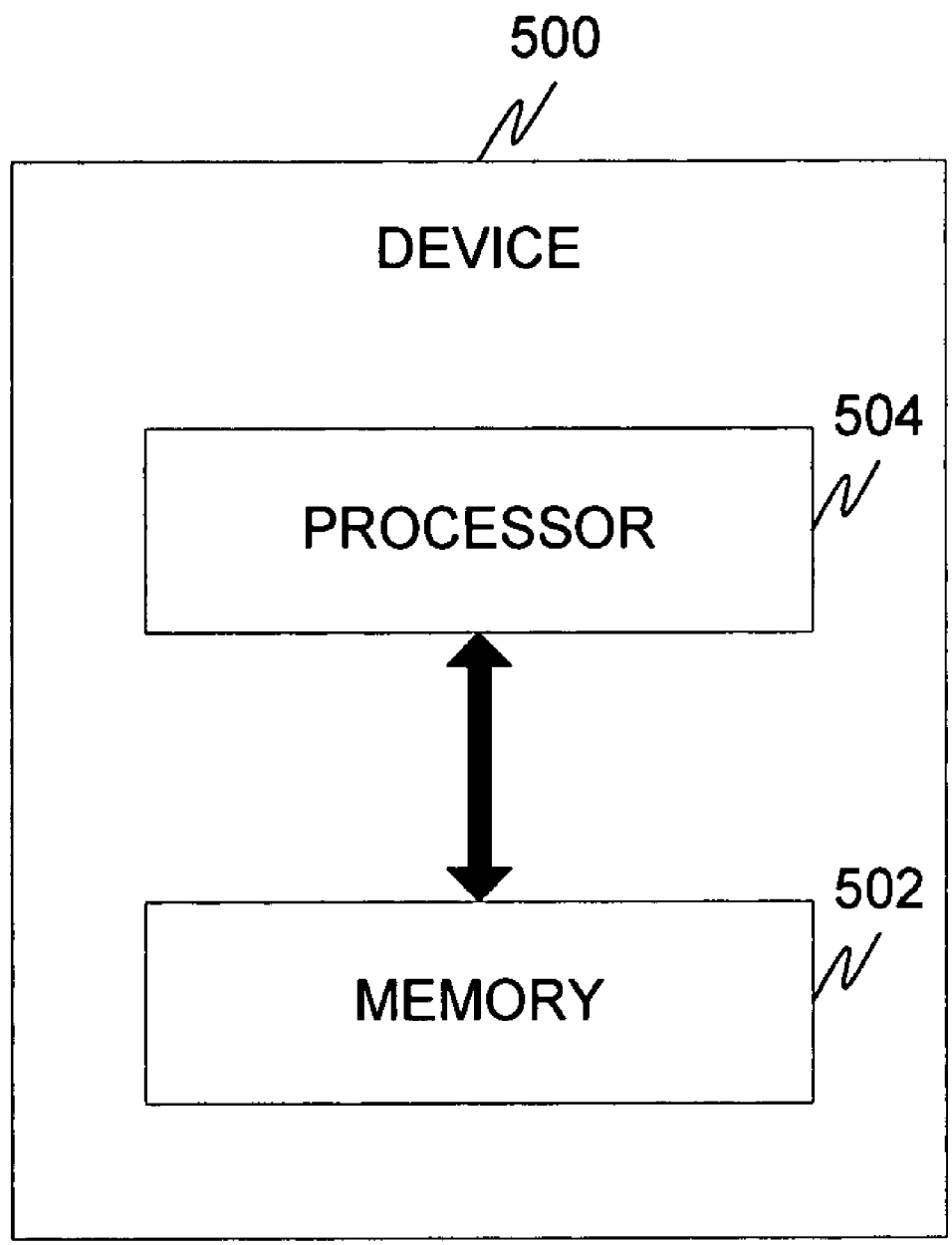
FIG. 5 illustrates a block diagram of a device for terminating an iterative decoding process of an FEC block, in accordance with an embodiment.

Referring now to FIG. 5, a block diagram of a device 500 for terminating an iterative decoding process of FEC block 102 is shown, in accordance with an embodiment. Device 500 includes a memory 502 and a processor 504 operatively coupled to memory 502. Memory 502 is configured for storing one or more of a first predefined threshold, a second predefined threshold, a predefined increment threshold, a predefined successive ratio threshold, a predefined local slope threshold and a predefined global threshold. The first predefined threshold, the second predefined threshold, the predefined increment threshold, the predefined successive ratio threshold, the predefined local slope threshold and the predefined global threshold are system parameters fixed either prior to the iterative decoding process of FEC block 102 or based on a front end scaling factor or an SINR estimate for FEC block 102.

Further, processor 504 is configured for calculating a metric based on one or more LLRs corresponding to a first number of iterations of a predetermined number of bits of the FEC block. In an embodiment, the metric is an MALLR computed over the first number of iterations of the iterative decoding process of FEC block 102. In another embodiment, the metric is calculated based on a sum of absolute LLRs pertaining to the first number of iterations of the iterative decoding process of FEC block 102. In yet another embodiment, the metric may be the LLRs.

Further, processor 504 is configured for formulating one or more stopping criteria for the iterative decoding process of FEC block 102, based on a variation pattern of the metric over a second predetermined number of iterations of the iterative decoding process. As mentioned earlier, the second predetermined number of iterations is a subset of the first number of iterations.

For formulating the one or more stopping criteria, processor 504 is further configured for checking a flatness of the variation pattern of the metric and/or identifying a non-increasing nature of the variation of the metric. In an embodiment, for checking the flatness of the variation pattern of the metric, processor 504 is further configured for determining whether a difference between a minimum metric value and a maximum metric value over the second predetermined number of iterations is less than or equal to the first predefined threshold stored in memory 502.

Moreover, processor 504 may also check the flatness of the variation pattern of the metric by checking whether an increment in the metric is less than or equal to the predefined increment threshold. Further, processor 504 may check whether a ratio between two or more successive metrics is less than or equal to the predefined successive ratio threshold. In an embodiment, processor 504 may check whether a local slope of the metric is less than or equal to the predefined local slope threshold or a global slope of the metric is less than or equal to the predefined global threshold. The local slope of the metric is computed over a third predetermined number of iterations. The third predetermined number of iterations being less than the second predetermined number of iterations. Moreover, as mentioned earlier, the third predetermined number of iterations may be a subset of the second predetermined number of iterations. Further, the global slope of the metric is computed over the first number of iterations of the iterative decoding process.

Additionally, in an embodiment, for identifying the non-increasing nature of the variation pattern of the metric, processor 504 is configured for checking whether a net increase in the metric over the second predetermined number of iterations is less than or equal to a second predefined threshold.

Further, when processor 504 detects that the one or more stopping criteria are met by the iterations of FEC block 102, processor 504 may terminate the iterative decoding process of FEC block 102. Those skilled in the art will appreciate that termination of the iterative decoding process of an FEC block, which is received with a significant amount of corruption, results in reduction of power consumption and processing time of the turbo decoder. This is due to the fact that if the FEC block is received significantly low SNIR, then the turbo decoder may not be able to decode the FEC block correctly, even after performing several decoding iterations. Therefore, it is advantageous to terminate the iterative decoding process of the FEC block received with low SNIR early, as it can be safely determined that proceeding further with the iterative decoding process may not help in decoding the FEC block.

The various embodiments described above provide methods and systems for terminating an iterative decoding process of a forward error correction block. The methods facilitate significant reduction in power consumption of a turbo decoder when performing iterative decoding of FEC blocks. Additionally, number of iterations required for decoding an FEC block is reduced thereby minimizing decoding time of the FEC block. Further, a significant increase in throughput of a turbo decoder can be achieved by employing the abovementioned methods.

What is claimed is:

1. A method for terminating an iterative decoding process of a Forward Error Correction (FEC) block, the method comprising:
    calculating, in a decoder, a metric based on one or more Log Likelihood Ratios (LLRs) corresponding to a first number of iterations of the iterative decoding process of the FEC block;
    formulating, in the decoder, one or more stopping criteria for the iterative decoding process based on a variation pattern of the metric over a second number of iterations of the iterative decoding process, wherein the second number of iterations is a subset of the first number of iterations; and
    terminating, in the decoder, the iterative decoding process of the FEC block based on the one or more stopping criteria.

2. The method of claim 1, wherein the terminating further comprises:
    estimating whether the FEC block is a successfully decoded FEC block, based on an independent success criterion; and
    terminating the iterative decoding process when the FEC block is estimated to be the successfully decoded FEC block.

3. The method of claim 1, wherein the first number of iterations and the second number of iterations comprises at least one of a half iteration and a full iteration.

4. The method of claim 1, wherein the metric is a Mean Absolute Log-Likelihood Ratio (MALLR) corresponding to the first number of iterations of the iterative decoding process of the FEC block.

5. The method of claim 4, wherein the MALLR is computed over one or more pairs of successive half iterations of the iterative decoding process of the FEC block, the one or more pairs of successive half iterations belonging to the first number of iterations.

6. The method of claim 1, wherein the metric is a sum of absolute LLRs corresponding to the first number of iterations of the iterative decoding process of the FEC block.

7. The method of claim 1, wherein the metric is calculated from the one or more LLRs of a predetermined number of bits of the FEC block.

8. The method of claim 1, wherein the one or more stopping criteria comprises checking a flatness of the variation pattern of the metric, wherein checking a flatness of the variation pattern of the metric comprises:

determining over the second number of iterations of the iterative decoding process, whether a difference between a minimum metric value and a maximum metric value of the metric is less than or equal to a first predefined threshold.

9. The method of claim 8, wherein the first predefined threshold is based on at least one of a front end scaling factor and a Signal to Interference Noise Ratio (SINR) estimate corresponding to the FEC block.

10. The method of claim 1, wherein the one or more stopping criteria comprises checking a flatness of the variation pattern of the metric, wherein checking a flatness of the variation pattern of the metric comprises:

checking whether an increment in the metric is less than or equal to a predefined increment threshold;
checking whether a ratio between two or more successive metrics is less than or equal to a predefined successive ratio threshold;
checking whether a local slope of the metric is less than or equal to a predefined local slope threshold, the local slope being computed over a third number of iterations, wherein the third number of iterations is less than or equal to the second number of iterations; and
checking whether a global slope of the metric is less than or equal to a predefined global threshold, the global slope being computed over the first number of iterations of the iterative decoding process.

11. The method of claim 1, wherein the one or more stopping'criteria comprises identifying a non-increasing nature of the metric, identifying a non-increasing nature of the metric comprising:

checking, over the second number of iterations of the iterative decoding process, whether a net increase in the metric is less than or equal to a second predefined threshold.

12. The method of claim 1, wherein calculating the metric includes calculating the metric at each iteration of the first number of iterations.

13. The method of claim 1, wherein a number of the second number of iterations is determined during the iterative decoding process.

14. A method for stopping an iterative decoding process of a Forward Error Correction (FEC) block, the method comprising:

receiving, at a decoder, a stopping indication, the stopping indication being generated based on one or more stopping criteria, wherein the one or more stopping criteria includes:
identifying, in a decoder, a non-increasing nature of a variation pattern of a metric by checking, over a second number of iterations of the iterative decoding process, whether a net increase in the metric is less than or equal to a predefined threshold, the metric being calculated based on one or more Log Likelihood Ratios (LLRs) corresponding to a first number of iterations of a predetermined number of bits of the FEC block; and
stopping the iterative decoding process of the FEC block based on the stopping indication.

15. A device for terminating an iterative decoding process of a Forward Error Correction (FEC) block, the device comprising:

a memory configured to store at least one of a first predefined threshold, a second predefined threshold, a predefined increment threshold, a predefined successive ratio threshold, a predefined local slope threshold, and a predefined global threshold; and
a processor operatively coupled to the memory, the processor configured to
calculate a metric based on a Log Likelihood Ratio (LLR) corresponding to a first number of iterations of a predetermined number of bits of the FEC block;
formulate one or more stopping criteria for the iterative decoding process of the FEC block based on a variation pattern of the metric over a second number of iterations of the iterative decoding process, wherein the second number of iterations is a subset of the first number of iterations; and
terminate the iterative decoding process of the FEC block based on the one or more stopping criteria.

16. The device of claim 15, wherein the processor is further configured to
check a flatness of the variation pattern of the metric; or
identify a non-increasing nature of the variation pattern of the metric.

17. The device of claim 16, wherein, to check the flatness of the variation pattern of the metric, the processor is further configured to
determine, over the second predetermined number of iterations of the iterative decoding process, whether a difference between a minimum metric value and a maximum metric value of the metric is less than or equal to the first predefined threshold, wherein the first predefined threshold is based on at least one of a front end scaling factor and a Signal to Interference Noise Ratio (SINR) estimate corresponding to the FEC block.

18. The device of claim 16, wherein, to check the flatness of the variation pattern of the metric, the processor is further configured to
check whether an increment in the metric is less than or equal to the predefined increment threshold;
check whether a ratio between two or more successive metrics is less than or equal to the predefined successive ratio threshold;
check whether a local slope of the metric is less than or equal to the predefined local slope threshold, the local slope being computed over a third number of iterations wherein the third number of iterations is less than or equal to the second number of iterations; and
check whether a global slope of the metric is less than or equal to the predefined global threshold, the global slope being computed over the first number of iterations of the iterative decoding process.

19. The device of claim 16, wherein, to identify the non-increasing nature of the variation pattern of the metric, the processor is further configured to
check, over the second number of iterations of the iterative decoding process, whether a net increase in the metric is less than or equal to a second predefined threshold.

20. The device of claim 15, wherein the processor is configured to calculate the metric at each iteration of the first number of iterations.

21. The device of claim 15, wherein a number of the second number of iterations is determined during the iterative decoding process.

* * * * *

UNITED STATES PATENT AND TRADEMARK OFFICE
CERTIFICATE OF CORRECTION

| | | |
|---|---|---|
| PATENT NO. | : 8,086,928 B2 | Page 1 of 1 |
| APPLICATION NO. | : 11/893329 | |
| DATED | : December 27, 2011 | |
| INVENTOR(S) | : Jalloul et al. | |

It is certified that error appears in the above-identified patent and that said Letters Patent is hereby corrected as shown below:

Column 11
Line 33, Claim 11, "stopping'criteria" should be replaced with --stopping criteria--.

Signed and Sealed this
Fifteenth Day of January, 2013

David J. Kappos
*Director of the United States Patent and Trademark Office*